United States Patent
Nemoto et al.

[11] Patent Number: 5,962,373
[45] Date of Patent: *Oct. 5, 1999

[54] METHOD FOR PRODUCING MIXED METAL OXIDE COMPOUNDS

[75] Inventors: Masaaki Nemoto; Shuichi Yoshikawa; Ryokan Yuasa; Isao Yoshida; Yorinobu Yoshisato, all of Tsukuba, Japan

[73] Assignee: Sanyo Electric Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/621,078

[22] Filed: Mar. 22, 1996

[30] Foreign Application Priority Data

Mar. 27, 1995 [JP] Japan ...................................... 7-68311

[51] Int. Cl.$^6$ ........................... H01L 39/24; C01G 15/00; H01B 3/10

[52] U.S. Cl. ......................... 505/120; 505/121; 505/473; 505/501; 505/742; 505/783; 505/784; 423/593; 427/62; 427/126.3

[58] Field of Search ................... 505/473, 501, 505/783, 120, 121, 742, 784; 423/593; 427/62, 63, 126.3

[56] References Cited

FOREIGN PATENT DOCUMENTS 02-291611 12/1990 Japan .
03-005321 1/1991 Japan .

OTHER PUBLICATIONS

Ichikawa et al, Appl. Phys. Lett. 53(10) Sep. 1988, pp. 919–921.
Hammond et al, Appl. Phys. Lett. 57(8) Aug. 1990, pp. 825–827.
Denhoff et al, Appl. Phys, Lett. 54(7), Feb. 1989, pp. 660–662.
Shah et al, Appl. Phys. Lett. 56(8), Feb. 1990, pp. 782–784.
Lin et al, Appl. Phys. Lett. 67(14) Oct. 1995, pp. 2084–2086.
Lee et al, Appl. Phys. Lett. 60(6) Feb. 1992, pp. 772–774.
Liou et al, Appl. Phys. Lett. 60(22) Jun. 1992, pp. 2803–2805.
Zhou et al, Jpn. J. Appl. Phys. 27(12) Dec. 1988, pp. L2321–2323.
Saito et al, Jpn. J. Appl. Phys. vol. 30 No. 5A, May 1991, pp. L820–L822.
Liu et al, J. Appl. Phys. 71(8), Apr. 15, 1992, pp. 4085–4087.
Ginley et al, IEEE Transactions On Applied Superconductivity vol. 3, No. 1, Mar. 1993, pp. 1201–1204.
Preparation of Superconducting $Tl_1Ba_2Ca_3Cu_4O_x$ Thin Films by RF Magnetron Sputtering, Zhou et al., Japanese Journal of Applied Physics, vol. 27, No. 12, Dec., 1988, pp. L2321–L2323.
Synthesis Process of the High $T_c$ Superconductor in the $Tl_2Ca_2Ba_2CU_3O_x$ Phase, Wang et al., Japanese Journal of Applied Physica, vol. 28, No. 4, Apr. 1989, pp. L587–L590.

*Primary Examiner*—Roy V. King
*Attorney, Agent, or Firm*—Loeb & Loeb LLP

[57] ABSTRACT

A precursor is made from a plurality of materials having different vapor pressures. The precursor and a source material are placed in a closed heat treatment furnace. The source material is materials which are the same as some of the materials contained in the precursor and having particular vapor pressures. The precursor and source material is thermally treated in the furnace while the source material is being supplied, so the particular materials in the precursor have their evaporation suppressed, thereby forming compounds. The compounds may be oxide superconductors, oxide dielectric, and so on.

5 Claims, 4 Drawing Sheets

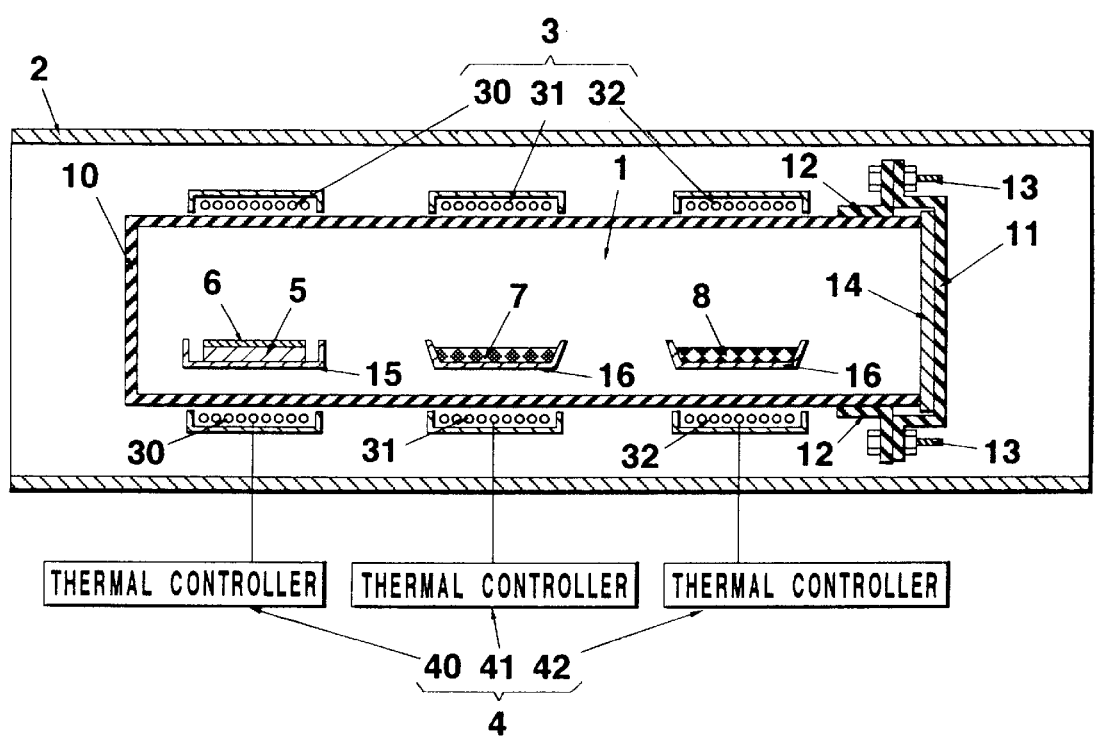

METHOD FOR PRODUCING MIXED METAL OXIDE COMPOUNDS

BACKGROUND OF THE INVENTION

1. Field of the Invention

This invention relates to a method and an apparatus for producing a compound, and more particularly to a method and an apparatus for producing a precursor from a plurality of materials having different vapor pressures, and forming a compound, having a predetermined composition ratio, from the precursor. When materials whose evaporation temperatures are equal to or near a crystallizing temperature of a compound (i.e. they have high vapor pressures) are used, the compound can be crystallized by suppressing evaporation of the materials having high vapor pressures.

2. Description of the Prior Art

Thallium (Tl) oxide superconductors are attracting a great deal of attention as promising superconductors applicable to communication fields such as satellite communications and mobile communications. The thallium oxide superconductor has a relatively small surface resistance Rs, and is relatively free from propagation loss in high frequency ranges such as microwave and millimeter wave ranges. Further, the thallium oxide superconductor has a critical temperature (transition temperature: Tc) of higher than 100 K, and is usable at high temperatures.

Generally, thallium oxide superconductors are TlBaCaCuO superconductors (thallium-barium-calcium-copper-oxide: TBCCO superconductors). In this TlBaCaCuO superconductor, thallium has a high vapor pressure It is well-known that thallium is evaporated before a crystallizing temperature is attained In other words, a composition ratio of thallium is reduced at the crystallizing temperature due to its evaporation, which makes TlBaCaCuO superconductor less reliable.

Because of this disadvantage, the TlBaCaCuO superconductor cannot be formed by the in-situ process which is generally applied to producing a YBaCuO (yttrium-barium-copper-oxide) superconductor. In order to produce the TlBaCaCuO superconductor, a precursor, which contains Tl, Ba, Ca, Cu and O and has an amorphous structure, is formed at a room temperature, and is then thermally treated at a crystallizing temperature of 800° C. In other words, the TlBaCaCuO superconductors are produced in two steps.

The method of producing the foregoing superconductors is prone to the following problems.

(1) At present, the TlBaCaCuO superconductor is only in the research stage, and has not been yet mass-produced. The inventors of the present invention have tried the following crystallizing processes so as to obtain the TlBaCaCuO superconductors. First of all, a precursor containing Tl, Ba, Ca, Cu and O and having an amorphous structure was formed. The precursor was a thin film, and was deposited on a surface of an MgO substrate. The precursor was wrapped with gold (Au) foil, and was placed in an open-type heat treatment furnace. The Au foil was used since it does not react with the precursor, i.e. Tl and $O_2$ in the precursor, thereby suppressing the evaporation of Tl and $O_2$ having high vapor pressures. The precursor was thermally treated in the furnace at a crystallizing temperature. Thus, a thin film of the TlBaCaCuo superconductor was obtained.

However, it is very difficult to completely seal the precursor with the Au foil manually wrapped thereon using small pincette. In other words, there are gaps in the Au foil through which evaporated Tl and $O_2$ may leak. Thus, composition ratios of Tl and $O_2$ will be reduced in the crystallized TlBaCaCuo superconductor. When Tl is reduced, the TlBaCaCuO superconductor is not superconductive, or has a low critical temperature even when it has superconductive characteristics. Further, when $O_2$ is reduced, the TlBaCaCuO superconductor has a rough surface, increases a surface resistance, and suffers from poor high frequency characteristics.

(2) Since the Au foil is manually wrapped, clearances through which the evaporated Tl and $O_2$ leak will have varying sizes. The composition ratios of Tl and $O_2$ in the crystallized TlBaCaCuO superconductor become variable, which makes it difficult to accomplish the target composition ratios.

(3) In order to improve characteristics of the TlBaCaCuO superconductor, i.e. high frequency characteristics, grain sizes should be larger (i.e. a crystallized surface should be flattened) so as to reduce the surface resistance. Usually, the longer the thermal treatment at the crystallizing temperature, the larger the grain sizes and the smaller the surface resistance. However, the longer the thermal treatment, the more Tl and $O_2$ will be evaporated and leak, which will worsen the superconductivity and high frequency characteristics.

SUMMARY OF THE INVENTION

The present invention is intended to overcome the foregoing problems of the prior art.

A first object of the invention is to provide a method of producing a compound consisting of materials having particular vapor pressures. In the method, evaporation of particular materials in the compound is suppressed so as to increase composition ratios of such materials. The method is preferably applicable to producing not only thallium oxide superconductors but also mercury oxide superconductors, lead oxide superconductors, oxide dielectrics and compound semiconductors.

It is a second object of the invention to reliably control composition ratios of particular materials in the compound.

A third object is not only to reliably control the composition ratios of particular materials in the compound but also to allow a longer thermal treatment of the compound.

A final object is to provide an apparatus to which the foregoing method is applicable.

According to a first aspect of the invention, there is provided a method of producing a compound which comprises the steps of: (a) forming a precursor from a plurality of materials having different vapor pressures; and (b) forming a compound having a predetermined composition ratio from the precursor. In the step (b), the precursor is placed in a sealed chamber with at least one source material whose vapor pressure is identical to a vapor pressure of a particular material contained in the precursor. In the step (b), the precursor is thermally treated so that the evaporation of the particular material therein is suppressed by the source material.

This method is effective in the following respects. First of all, the precursor is prepared in the sealed chamber filled with materials having particular vapor pressures. The source material having the same vapor pressures as those of the precursor are supplied in the sealed chamber, thereby raising a pressure of the particular material in the sealed chamber. In this state, the precursor is thermally treated in the sealed chamber so as to obtain a compound. Since the evaporation of the particular material in the precursor is suppressed by the source material, the obtained compound can have a large composition ratio of the material having a predetermined vapor pressure. This concept of increasing the composition ratio of the particular material includes to lessen a reduction of composition ratio of the particular material, and to prevent a reduction or increase of the composition ratio of a particular material.

Secondly, the compound is formed in the sealed chamber while the material having the particular vapor pressure is being supplied, which prevents leakage of such a material. Therefore, it is possible to increase the pressure of the material having the particular vapor pressure (make the material dense) and maintain this state. This enables the compound to be formed for a long time period while the pressure of the material is reliably maintained.

According to a second aspect, in the step (a), the precursor may be placed in the sealed chamber with the source material whose vapor pressure is higher than a vapor pressure of the particular material contained in the precursor. In the step (b), the precursor is thermally treated so that the evaporation of the material having the higher vapor pressure and being contained therein is suppressed by the source material. This process is as effective as the process mentioned above.

In accordance with a third aspect, a volume of the source material may be greater than a volume of the particular material of the precursor. A sufficient volume of the source material is supplied in the sealed chamber, thereby increasing the pressure of the particular material in the sealed chamber. In this state, the evaporation of the particular material of the precursor is suppressed, thereby obtaining the compound in which the evaporation of the particular material is suppressed. In other words, the composition ratio of the particular material is increased in the compound.

In a fourth aspect, the volume of the source material and a volume of the particular material of the precursor may be determined such that a vapor pressure of the source material is substantially balanced with the vapor pressure of the particular material of the precursor. In this state, the evaporation of the particular material in the precursor can be reliably suppressed, so it is possible to prevent a variation of the composition ratio of the particular material in the compound.

In the step (a) of a fifth aspect, the precursor may be made from materials having low and high vapor pressures. The precursor is placed in the sealed chamber with the source materials having vapor pressures identical to the high vapor pressures of particular materials contained in the precursor. Then, the precursor is thermally treated so that the evaporation of the particular materials therein is suppressed by the source material, thereby obtaining a compound having the predetermined composition ratio. The evaporation of the materials having high vapor pressures can be independently suppressed, so the composition ratios of the materials having high vapor pressures can be increased in the obtained compound. The pressures of such materials can be so reliably maintained in the sealed chamber that the compound can be formed in a reliable state for a long time period. The source materials are independently supplied, so the composition ratios of such materials are increased in the obtained compound.

According to a sixth aspect, in the step (b), the source materials may consist of similar constituents having high vapor pressures, and a composition ratio of one of constituents in one source material being greater than a composition ratio of the same constituent in the other source material. In the sealed chamber, the pressure of the foregoing constituent of one source material can be set to be higher than that of the same constituent in the other source material. Thus, it is possible to independently control the pressures in the sealed chamber in accordance with the constituents of the source materials.

In a seventh aspect, in the step (a), the precursor may have an amorphous structure. In the step (b), the amorphous precursor is crystallized with the evaporation of the particular materials suppressed. It is possible to obtain a compound having an amorphous structure from the amorphous precursor.

According to an eighth aspect, in the step (a), the precursor may be of an oxide compound, and in the step (b), the source material may be oxygen at least as the material having a particular vapor pressure. The precursor made from the oxide compound is thermally treated by oxygen as the source material. The evaporation of at least oxygen contained in the precursor is suppressed by the source material, thereby producing an oxide compound containing oxygen with a predetermined composition ratio. The obtained oxide compound is as effective as the first-mentioned compound.

In a ninth aspect, in the step (a), the precursor may be made from materials for constituting an oxide superconductor. In the step (b), oxygen as the source material is used to suppress the evaporation of oxygen from the precursor which is thermally treated, thereby obtaining an oxide superconductor having a predetermined composition ratio. The obtained compound is as effective as the first-mentioned compound.

In a tenth aspect, the step (a) may include directly depositing materials for constituting an oxide superconductor on an MgO, $LaAlO_3$, $SrTiO_3$ or YSZ substrate, or depositing materials for constituting an oxide superconductor on the substrate via a thin film of MgO, $LaAlO_3$, $SrTiO_3$ or YSZ. When the substrate is MgO, $LaAlO_3$, or thier thin films, it is easy to control an orientation of a crystalline structure of the oxide superconductor (e.g. C axis orientation). Thus, the oxide superconductor can have a crystalline structure suitable for high frequency devices. On the other hand, when the substrate is $SrTiO_3$, YSZ, or their thin films, the oxide superconductor has a crystalline structure suitable for applications other than high frequency devices.

According to an eleventh aspect, in the step (a), the precursor may be made from materials for constituting a thallium oxide superconductor, and in the step (b), at least oxygen and thallium as the source material is used to suppress evaporation of oxygen and thallium from the precursor which is thermally treated, thereby obtaining a thallium oxide superconductor having predetermined oxide and thallium composition ratios. The obtained thallium oxide superconductor is as effective as the foregoing superconductors.

In a twelfth aspect, in the step (a), materials such as Tl, Ba, Ca, Cu and O may be used to form the precursor containing materials for constituting a thallium oxide superconductor. In the step (b), one source material may be $Tl_2O$ having a greater composition ratio of thallium, the other source material may be $Tl_2O_3$ having a greater composition ratio of oxygen. The precursor is thermally treated in oxygen and thallium as the source materials so that the evaporation of oxygen and thallium contained in the precursor is suppressed, thereby obtaining a thallium oxide superconductor having the predetermined composition ratios of oxygen and thallium.

This thallium oxide superconductor is not only as effective as the foregoing thallium oxide superconductor but is also advantageous in the following respects.

First of all, thallium (having a high vapor pressure) from the source material containing $Tl_2O$ is effective in controlling the pressure of thallium in the sealed chamber, and oxygen (having a high vapor pressure) from the source material containing $Tl_2O_3$ is also effective in controlling the pressure of oxygen in the sealed chamber. In other words, thallium and oxygen can be independently controlled in the sealed chamber. The composition ratios of thallium and oxygen in the TlBaCaCuO superconductor can be controlled to an optimum state, so the superconductor has a good superconductivity.

Secondly, since the composition ratio of thallium in TlBaCaCuO superconductor is controlled by thallium from the source material containing $Tl_2O$, the superconductor can maintain its characteristics such as high critical temperatures. Generally, the more thallium, the lower a melting point of the TlBaCaCuO superconductor, and the more the orientation of a crystalline structure of the superconductor is determined in accordance with a crystalline structure of a substrate or buffer layer. Thus, this superconductor can have a reliable C axis orientation which is expected to be applicable to superconductor devices.

Thirdly, the composition ratio of oxygen in the TlBaCaCuO superconductor is controlled by oxygen supplied by the source material containing $Tl_2O_3$, which enables the superconductor to have a flat surface. The flatter the surface, the larger a grain size of the superconductor. This can reduce boundaries between crystalline grains on the superconductor surface. Thus, the superconductor can have a reduced surface resistance and an increased critical current.

Finally, since the crystallization is performed in the sealed chamber, substantially no thallium and oxygen will leak therefrom, which enables the crystallization to be carried out with the vapor pressures of thallium and oxygen maintained at constant values. Even when the crystallization takes a long time, the evaporation of thallium and oxygen from the superconductor can be suppressed. This is effective in increasing the grain size and reducing grain boundaries on the superconductor surface. The superconductor has a reduced surface resistance and an increased critical current.

In a thirteenth aspect, in the step (b), one source material containing $Tl_2O$ may be heated to an optimum temperature for thallium evaporation, the other source material containing $Tl_2O_3$ may be heated to an optimum temperature for oxygen evaporation, and the precursor may be heated to a crystallizing temperature. These temperature are different from one another. The source materials containing $Tl_2O$ and $Tl_2O_3$ and the precursor are respectively heated to their optimum temperatures so as to form a thallium oxide superconductor.

According to a fourteenth aspect, in the step (a), the precursor may be made from materials for constituting a mercury oxide superconductor, and in the step (b), the source material may be mercury and oxygen at least as materials having high vapor pressures, and the precursor is thermally treated in mercury and oxygen as the source material, thereby obtaining a mercury oxide superconductor having predetermined composition ratios of mercury and oxygen. The obtained superconductor is as effective as the foregoing superconductors.

In a fifteenth aspect, in the step (a), the precursor may be made from materials such as Hg, Ba, Ca, Cu and O for constituting the mercury oxide superconductor, and in the step (b), the source material may be at least Hg and HgO having high vapor pressures, and the precursor is thermally treated in mercury and oxygen as the source material with the evaporation of mercury and oxygen in the precursor suppressed, thereby obtaining a mercury oxide superconductor having predetermined composition ratios of mercury and oxygen. This superconductor is as effective as the foregoing superconductors.

In a sixteenth aspect, in the step (a), the precursor may be made from materials such as Ba, K, Bi and O for constituting the oxide superconductor, and in the step (b), the source material may be $K_2O$ containing potassium whose vapor temperature is high and $K_2O_2$ containing more oxygen whose vapor temperature is high, and the precursor is thermally treated in $K_2O$ and $K_2O_2$, thereby obtaining a BaKBiO superconductor. This superconductor is as effective as the foregoing superconductors.

In a seventeenth aspect, in the step (a), the precursor may be made from materials for constituting an oxide dielectric, and in the step (b), materials including at least oxygen having a high vapor pressure may be used to form an oxide dielectric including oxygen having a predetermined composition ratio. This oxide dielectric is as effective as the oxide compound in the eighth aspect.

In accordance with an eighteenth aspect, in the step (a), the precursor may be made from Pb, Zn, Nb and O for constituting an oxide dielectric, and in the step (b), a source material may be $Pb_3O_4$ having a greater composition ratio of at least lead with a high vapor pressure, and $PbO_2$ having a greater composition ratio of at least oxygen with a high vapor pressure, and the precursor is thermally treated in lead and oxygen as the source material, thereby obtaining a PbZnNbO dielectric.

In a nineteenth aspect, in the step (a), the precursor may be made from materials including at least gallium and arsenic, and in the step (b), the precursor (6) is thermally treated in the source material consisting of at least gallium and arsenic with high vapor pressures, thereby obtaining a compound semiconductor.

According to a twentieth aspect, there is provided a compound manufacturing apparatus comprising: a sealed chamber for hermetically housing a precursor made from materials having different vapor pressures, and a source material having the same vapor pressures as some of the materials constituting the precursor; a first heater positioned in a part of the sealed chamber and for heating the precursor; a first heat controller for thermally controlling the first heater; a second heater positioned in another part of the sealed chamber and for heating and evaporating the source material; and a second heat controller for thermally controlling the second heater.

In this arrangement, the precursor and the source material are placed in the sealed chamber, and are respectively heated and controlled by their corresponding heaters and heat controllers. Further, the materials in the compound can be respectively controlled with respect to their vapor pressures. Thus, the composition ratios of particular materials can be increased in the compound. This enables the compound to be reliably formed over a long time period.

BRIEF DESCRIPTION OF THE DRAWINGS

The invention will become more apparent from the following detailed description of presently preferred embodiments when taken in conjunction with the accompanying drawings.

FIG. 1 schematically shows the configuration of a closed type heat treatment furnace used for producing a TlBaCaCuO superconductor according to a first embodiment of the invention;

DESCRIPTION OF THE PREFERRED EMBODIMENTS

Figure 2A:
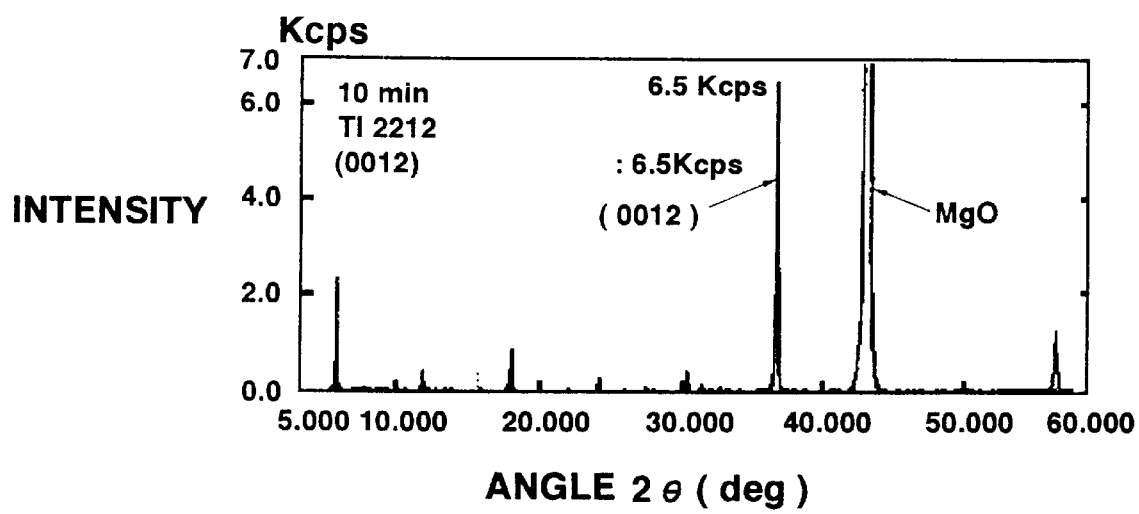
FIG. 2A and FIG. 2B are X-ray diffraction patterns of the TlBaCaCuO superconductor.

A method of producing a TlBaCaCuO superconductor of the invention will be described with reference to preferred embodiments.

Structure of a closed type heat treat furnace

Referring to FIG. 1, a closed type heat treatment furnace comprises a sealed chamber 1, a quartz tube 2, a heating unit 3, and a heater control unit 4. The sealed chamber 1 defines a sealed (airtight) space. In the sealed chamber 1, a precursor having an amorphous structure is thermally treated at a crystallizing temperature so as to obtain a crystallized TlBaCaCuO superconductor. The sealed chamber 1 mainly includes a cylindrical body 10 and a lid 11. In a first embodiment, the cylindrical body 10 is approximately 4 cm to 6 cm long, has a diameter of approximately 1.5 cm to 2.0 cm, and is approximately 1.0 mm thick. The cylindrical body 10 is made of a material which is strong, at least resistant to the crystallizing temperature, acid-resistant not to affect composition ratios of the TlBaCaCuO superconductor during the crystallization, and resistant to pressures (approximately 2 to 5 gas pressures) applied during the crystallization. In the embodiment, the cylindrical body 2 is made from aluminum oxide (alumina: $Al_2O_3$). Alternatively, heat resisting steel (an alloy of Ni—Cr—Fe, so-called "inconel") may be used for the cylindrical body 2. The lid 11 also has the same characteristics as those described above, and is made from a similar material to that of the cylindrical body 10.

A pair of lugs 12 are disposed on an outer surface of the cylindrical body 10 near the lid 11. The lid 11 is attached to the lugs 12 using a pair of fasteners 13 which include bolts and nuts. When attached, the lid 11 and the cylindrical body 10 define the completely airtight space which is insulated from an ambient atmosphere. The fasteners 13 should have characteristics identical to those of the cylindrical body 10 and the lid 11, and should be very strong. Thus, the fasteners 13 are made of the foregoing heat resistant steel.

A gasket 14 is used so as to seal an open end of the cylindrical body 10 together with the lid 11 and to enhance airtightness. The gasket 14 should not affect the composition of the TlBlCaCuO superconductor when it is being crystallized. To meet this requirement, the gasket 14 is made of a gold (Au) plate in this embodiment.

Prior to the crystallization, the precursor 6, source materials 7 and 8 are placed in the sealed space within the cylindrical body 10.

The precursor 6 is made from Tl, Ba, Ca, Cu and O for constituting the TlBaCaCuO superconductor, and is amorphous. The composition ratio of the precursor 6 is essentially the same as that of the crystallized TlBaCaCuO superconductor. In the precursor 6, the composition ratio of a particular material, i.e. at least Tl or O having a high vapor pressure, may be less than the composition ratio of Tl or O in the final TlBaCaCuO superconductor. In such a case, the particular material may be supplemented during the crystallization, so the final TlBaCaCuO superconductor will have the target composition ratio.

When heated above 100 K or higher, the precursor 6 will become a TlBaCaCuO superconductor.

According to the invention, $Tl_2Ba_2Ca_{n-1}Cu_nO_{2n+4}$ superconductors (where n=1–4) will be produced. Typical examples of TlBaCaCuO superconductors are: $Tl_2Ba_2Ca_0Cu_1O_6$; $Tl_2Ba_2Ca_1Cu_2O_8$; and $Tl_2Ba_2Ca_2Cu_3O_{10}$ superconductors. Further, $Tl_1Ba_2Ca_{n-1}Cu_nO_{2n+3}$ superconductors (where n=1–6) are also produced. Still further, the following Tl oxide superconductors are available: $Tl_2Ba_2(Ca, Y)_1Cu_2O_8$; $Tl_1Sr_2Ca_{n-1}Cu_nO_{2n+3}$ (where n=2, 3); $(Tl, Pb)_1Sr_2Ca_{n-1}Cu_nO_{2n+3}$ (where n=1, 2, 3); $(Tl, Bi)_1Sr_2Ca_{n-1}Cu_nO_{2n+3}$ (where n=2, 3); $Tl_1Sr_2(Ca, Ln)_1Cu_2O_7$; and $(Tl, Pb)(Sr, Ln)_2Cu_1O_5$ superconductors.

In this embodiment, the precursor 6 is directly deposited, on the substrate 5, as an amorphous film having a thickness of approximately 0.5 $\mu$m to 1.5 $\mu$m. The substrate 5 is an MgO substrate or an $LaAlO_3$ substrate which can assure reliable high frequency characteristics with respect to a dielectric constant and dielectric loss (propagation loss: tan$\delta$). An $SrTiO_3$ or YSZ (yttrium-stabilized zirconia) substrate is also usable although it has somewhat reduced high frequency characteristics. Further, it is possible to deposit the precursor 6 on an Si substrate via a thin film of MgO, $LaAlO_3$, $SrTiO_3$ or YSZ as a buffer layer.

Referring to FIG. 1, the substrate 5 carrying the precursor 6 thereon is placed on a tray 15 in the sealed chamber 1. The tray 15 should be resistant to the crystallizing temperature and should not affect the composition ratio of the TlBaCaCuO superconductor during the crystallization. In this embodiment, the tray 15 is made of gold.

The source material 7 is mainly thallium (Tl) which is supplied to the sealed space during the crystallization, and raises a pressure of thallium (concentration) in the sealed chamber 1. Thallium is effective in suppressing the evaporation of thallium from the precursor 6. Thallium has a high vapor pressure. Specifically, the source material 7 raises the pressure in the sealed chamber 1, so the pressure of thallium in the sealed chamber 1 is made to be balanced with the vapor pressure of thallium constituting the precursor 6. Further, the pressure of thallium in the sealed chamber 1 exceeds the vapor pressure of thallium constituting the precursor 6.

Alternatively, the source material 7 is thallium with a high vapor pressure, e.g. $Tl_2O$, which is effective in suppressing the evaporation of thallium contained in the precursor 6. A volume of thallium (the source material 7) is larger than the volume of thallium contained in the precursor 6. The source material containing $Tl_2O$ is in the form of either powder or pellets (bulk). The source material is placed on a gold (Au) tray 16 similarly to the tray 15.

$O_2$ is supplied as the source material (8) in the sealed chamber 1 during the crystallization, raising a pressure (concentration) of $O_2$ in the sealed chamber 1. This $O_2$ suppresses the evaporation of $O_2$ contained in the precursor 6 and having a high vapor pressure, i.e. the former $O_2$ raises the pressure of $O_2$ in the sealed chamber 1. Thus, the pressure of $O_2$ in the sealed chamber 1 becomes equal to the vapor pressure of $O_2$ contained in the precursor 6. The more $O_2$ is supplied as the source material 8, the more quickly the pressure of $O_2$ in the sealed chamber 1 is balanced with the vapor pressure of $O_2$ in the precursor 6. Finally, $O_2$ in the sealed chamber 1 exceeds $O_2$ in the precursor 6.

For instance, the source material 8 containing $Tl_2O_3$ has more $O_2$ with the high vapor pressure. $Tl_2O_3$ suppresses the evaporation of $O_2$ from the precursor 6. The volume of $O_2$ as the source material 8 is more than that contained in the precursor 6. $Tl_2O_3$ is either powder or pellets, and is placed in another tray 16.

The precursor 6 is preferably placed deep inside the cylindrical body 10 so as to maintain the pressures of Tl and $O_2$ at constant values, i.e. at the end opposite to the open end. However, when the cylindrical body 10 is sufficiently airtight, the precursor 6 may be placed at any position, e.g. the precursor 6 may be placed at the center of the cylindrical body 10, i.e. between the source materials 7 and 8. Further, the precursor 6 may be placed near the entrance of the cylindrical body 10.

Alternatively, the source material 7 or 8 may be one of Tl, Ba, Ca, Cu and O constituting the precursor 6. In this case, the number of source materials can be reduced, which is effective in reducing a size of the closed type heat treatment furnace.

The sealed chamber 1 is housed in the quartz tube 2 which communicates with an exhaust system, not shown. The heating unit 3 is attached on an outer surface of the quartz tube 2, and the thermal control unit 4 is disposed outside the quartz tube 2. The heating unit 3 includes a crystallizing heater 30, and source material heaters 31 and 32. The thermal control unit 4 is connected to the heating unit 3, and includes a thermal controller 40 for the crystallizing heater 30, and thermal controllers 41 and 42 for the source material heaters 31 and 32.

The crystallizing heater 30 is positioned such that it can heat the precursor 6 when the sealed chamber 1 is inserted into the quartz tube 2. The crystallizing heater 30 is connected to and controlled by the thermal controller 40. The source material heater 31 is positioned such that it can heat the source material 7 when the sealed chamber 1 is inserted into the quartz tube 2. Further, the source material heater 32 is positioned such that it can heat the source material 8 when the sealed chamber 1 is inserted into the quartz tube 2. The source material heaters 31 and 32 are respectively connected to and controlled by the thermal controllers 41 and 42.

Method of producing a TlBaCaCuO superconductor

The following describe a method of producing a $Tl_2Ba_2Ca_1Cu_2O_x$ superconductor (where x=6, 8, or 10), which is an example of the TlBaCaCuO superconductor, has a critical temperature of approximately 110 K and excellent high frequency characteristics, and contains a normal amount of oxygen.

First of all, a precursor 6 is directly deposited on the surface of an MgO (or $LaAlO_3$) substrate 5, using a magnetron sputtering technique. The magnetron sputtering is performed using a $Tl_2Ba_2Ca_1Cu_2O_x$ target, which is made from the same materials constituting a final $Tl_2Ba_2Ca_1Cu_2O_x$ superconductor and has the same composition ratio as that of the final superconductor. The sputtering is performed under the following conditions.

Substrate temperature: Room temperature (substrate not heated)

Sputtering gas: Ar

Gas pressure: 30 mtorr

Effective output: 90 W

Basically, the substrate 5 is not heated. However, the substrate 5 reaches a temperature of approximately 100° C. during the sputtering process. This temperature is below temperatures where Tl and $O_2$ are evaporated. Therefore, the substrate temperature may be set in a range below the evaporation temperatures of Tl and $O_2$.

The magnetron sputtering under the foregoing conditions results in a precursor (film) 6, on the substrate 5, which is made from $Tl_2$, $Ba_2$, $Ca_1$, $Cu_2$ and $O_x$, and has an amorphous structure. When evaporated at the crystallizing temperature, thallium adversely affects the high frequency characteristics of the superconductor. Further, the evaporation of $O_2$ also exerts an influence on the high frequency characteristics. Therefore, the substrate temperature should be preferably set at a low value where the materials having high vapor pressures are not evaporated.

Then, the precursor 6 is thermally treated and crystallized in the closed type heat treat furnace so as to obtain a thin film of $Tl_2Ba_2Ca_1CuO_x$ superconductor, as described below.

First of all, the substrate 5 carrying the precursor 6 thereon is placed on the tray 15. The source materials 7 and 8 are respectively placed on their corresponding trays 16. These trays 15 and 16 are put into the sealed chamber 1, which is inserted into the cylindrical body 10. The cylindrical body 10 is closed by the gasket 14 and the lid 11, which is tightly fastened by the fasteners 13. This enables the airtight space to be secured within the sealed chamber 1.

The cylindrical body 1 is then inserted into the quartz tube 2, so the precursor 6 and the source materials 7 and 8 are aligned with their corresponding heaters 30, 31 and 32, respectively. The precursor 6 is heated to the crystallizing temperature by the crystallizing heater 30 under the control of the thermal controller 40. The crystallizing temperature is set between 800° C. and 900° C. The source material 7 (i.e. $Tl_2O$) is heated by the heater 31 to the evaporation temperature of thallium Tl under the control of the thermal controller 41. The evaporation temperature of Tl is set between 650° C. and 850° C. Further, the source material 8 (i.e. $Tl_2O_3$) is heated by the heater 32 to the evaporation temperature of $O_2$ under the control of the thermal controller 42. This evaporation temperature is set to 650° C. to 850° C.

When the temperatures of the heaters 31 and 32 are set to high values, the source materials 7 and 8 emit more Tl, which increases the pressure (concentration) of Tl in the closed chamber 1. Thus, the TlBaCaCuO superconductor can have more Tl. Further, the higher the source material 8 is heated by the heater 32, the more $O_2$ can be supplied to the sealed chamber 1, thereby enabling the TlBaCaCuO superconductor to have more $O_2$. The thermal controllers 40, 41 and 42 can independently control their corresponding heaters 30, 31 and 32 to respective temperatures. It is easy to produce the final TlBaCaCuO superconductor having an optimum composition ratio.

According to the invention, the crystallization is performed through prolonged heat treatment, thereby obtaining a thin $Tl_2Ba_2Ca_1Cu_2O$ superconductor on the substrate 5. The heat treatment is performed for 20 to 60 minutes. During the crystallization, the precursor 6 and the source materials 7 and 8 (Tl and $O_2$) are placed in the closed chamber 1. Tl and $O_2$ from the source materials 7 and 8 suppress the evaporation of Tl and $O_2$ from the precursor 6, so the heat treatment can be performed for a long time period.

Figure 2B:
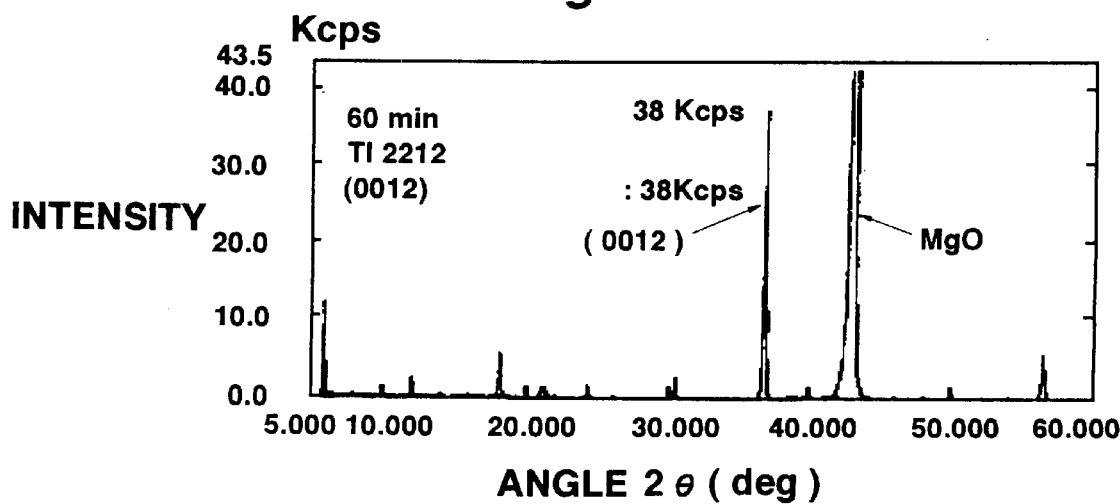
Figure 3A:
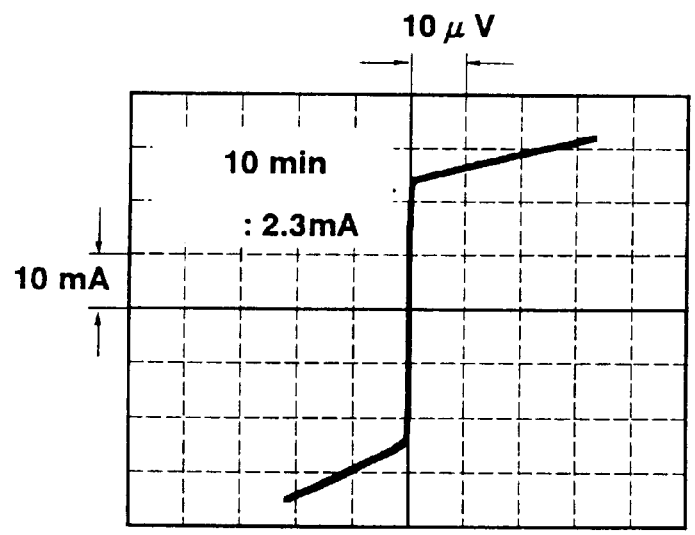
FIG. 3A and FIG. 3B are current-voltage characteristics of the TlBaCaCuO superconductor.
Figure 3B:
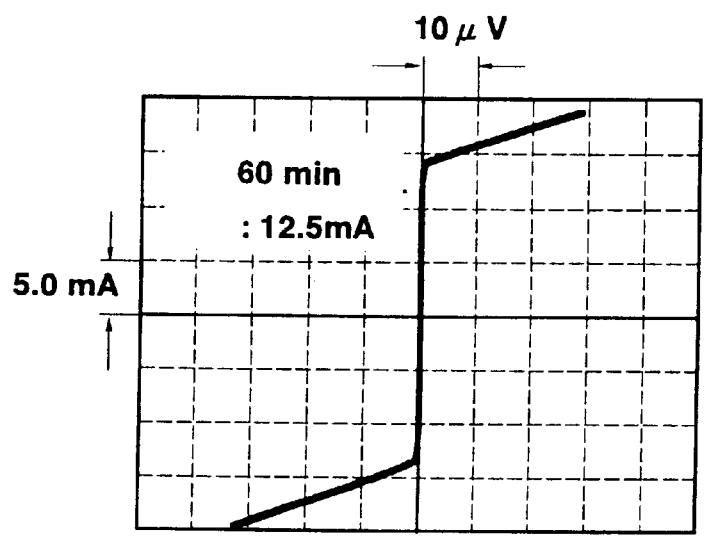

FIGS. 2A and 2B are graphs showing characteristics of $Tl_2Ba_2Ca_1Cu_2O_x$ superconductor after X-ray diffraction. Current and voltage characteristics of the foregoing superconductor are shown in FIGS. 3A and 3B.

The superconductor, thermally treated for approximately 10 minutes under the foregoing crystallizing conditions and subjected to the X-ray diffraction, has the characteristics shown in FIG. 2A. A crystalline structure (0012) of Tl is detected on the MgO substrate, and has a peak intensity of 6.5 Kcps. During crystallization of the precursor 6, the evaporation of Tl from the precursor 6 is suppressed, which enables Tl to be retained in the TlBaCaCuO superconductor. This superconductor has the current-voltage characteristics as shown in FIG. 3A. The superconductor allows a current to flow at zero volts. A critical current is 2.3 mA. In other words, the evaporation of Tl and $O_2$ from the precursor 6 is suppressed, so the TlBaCaCuO superconductor is obtainable FIGS. 2B and 3B show the characteristics of the superconductor thermally treated for 60 minutes and subjected to the X-ray diffraction. In this case, a crystalline structure (0012) is observed on the MgO substrate The superconductor has a peak intensity of 38 Kcps. During the crystallization, the evaporation of Tl from the precursor 6 is suppressed, Tl as the source material is incorporated into the materials constituting the TlBaCaCuO superconductor. A long thermal treatment enhances crystallization of the precursor 6. The superconductor allows a current to flow even when a voltage is zero. A critical temperature is raised to 12.5 mA. In other words, the evaporation of Tl and $O_2$ is suppressed, grain boundaries can be reduced through a long thermal treatment, and a surface electrical resistance is reduced. A critical temperature is raised. The long thermal treatment allows a grain boundary size of the TlBaCaCuO superconductor to be increased, and a surface of the crystalline structure to be further flattened.

Figure 4:
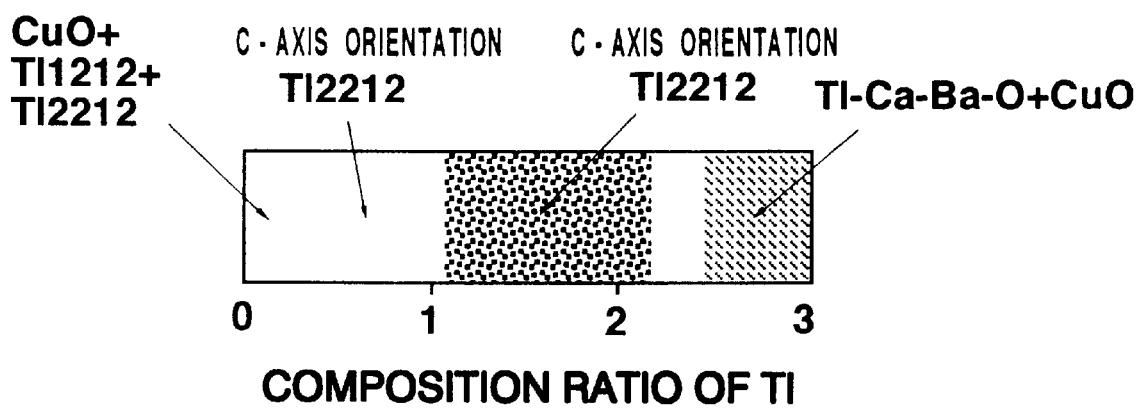
FIG. 4 shows the relationship between a composition ratio of a source material Tl and a crystallized structure of the crystallized TlBaCaCuO superconductor.

FIG. 4 shows the relationship between a composition ratio of pellets Tl and a crystallized structure of a $Tl_yBa_2Ca_2Cu_3O_x$ superconductor (where y=0.3–2.2), when pellets of Tl, Ba, Ca, Cu and O are used as materials to be supplied during the thermal treatment (annealing). When the composition ratio of Tl is as much as approximately 0.3 to 1.1, a crystalline structure of this superconductor is non-orientated. Conversely, when the composition ratio of Tl is between 1.1 and 2.2, the crystalline structure of the superconductor is orientated toward an axis C. The inventors have confirmed that the more Tl is used during the crystallization, the lower a melting point of Tl, and the further the crystallization is promoted depending upon the crystalline state of the substrate. Thus, the crystalline structure is orientated toward the axis C.

After the $Tl_2Ba_2Ca_1Cu_2O_x$ superconductor is formed, the sealed chamber 1 is taken out of the quartz tube 2, so the formed superconductor is removed from the cylindrical body 10 in the reverse order to that for forming the superconductor. Tl is toxic while it is gaseous. However, since the superconductor is removed from the cylindrical body 10 after Tl has solidified, the removal can be safely carried out without any problem.

If Tl and $O_2$ are supplied via separate routes in an open type heat treat furnace, an area around where $O_2$ is injected is subject to a drastic reduction of temperature in the furnace. Thallium Tl may be deposited in that area. However, the closed type heat treatment furnace is free from such a problem. With the closed type heat treat furnace, as the source materials 7 and 8 are heated by the heaters 31 and 32, the temperature within the sealed chamber 1 is raised, which enables evaporated Tl and $O_2$ to be continuously diffused.

Another method of forming TlBaCaCuO superconductors

In the foregoing embodiment, the precursor 6 is a thin film. Alternatively, the precursor 6 may be in another shape. First of all, powders of $BaCO_3$, $CaCO_3$ and CuO are prepared. Ba, Ca and Cu in each of the foregoing mixtures have the molar ratio of 2:1:2. The mixed powders are prebaked at 930° C. for five hours.

The prebaked mixture is crushed, and is mixed with a powder of $Tl_2O_3$. This powder is a mixture of Tl, Ba, Ca, Cu and O in the ratio of 2:2:1:2:x. The crushed mixture and the powder $Tl_2O_3$ are press-molded, thereby obtaining a precursor 6.

Application of the invention to other oxide superconductors, oxide dielectrics, compound semiconductors The method of the invention is applicable to producing Hg superconductors such as an HgBaCaCuO superconductor. In this case, a source material Hg supplies Hg having a high vapor pressure, and a source material HgO supplies $O_2$ having the high vapor pressure.

The method is also applicable to Ba superconductors such as BaKBiO superconductors. In this case, a source material $K_2O$ supplies K having a high vapor pressure, and a source material $K_2O_2$ supplies $O_2$ having the high vapor pressure.

Further, the method is applicable to producing oxide dielectrics such as a $Pb_3(ZnNb_2)O_9$ dielectric. A source material $Pb_3O_4$ supplies Pb having a high vapor pressure, and a source material $PbO_2$ supplies $O_2$.

Still further, the method is applicable to producing compound semiconductors, e.g. GaAs compound semiconductors. Source materials Ga and As having high vapor pressures are used in this case.

It is appreciated that the present invention is not limited to the foregoing embodiments. Specifically, the invention is applicable to producing amorphous compounds from amorphous precursors, and producing crystalline compounds from crystalline precursors. Further, the invention is applicable to producing polycrystal compounds from monocrystal precursors, and producing monocrystal compounds from polycrystal precursors. In any cases, the evaporation of materials having particular vapor pressures is suppressed, and composition ratios of particular materials are controlled as desired.

The present invention is advantageous in the following respects. First of all, the evaporation of particular materials contained in compounds can be suppressed, so the compounds can be produced with composition ratio of the particular materials increased. Secondly, the composition ratios of the particular materials can be reliably controlled. Third, the thermal treatment can be performed for a long time period. Finally, the invention provides an apparatus for producing the foregoing compounds.

What is claimed is:

1. A method of producing a thallium oxide superconductor compound, comprising the steps of:
    (a) forming a precursor from a plurality of chemical elements including Tl, Ba, Ca, Cu and O;
    (b) placing the precursor in a chamber;
    (c) placing at least two source materials in the chamber, a first one of the source materials containing $Tl_2O$ and a second one of the source materials containing $Tl_2O_3$, the first and second source materials being in a liquid or solid state;
    (d) sealing the chamber in an airtight manner; and
    (e) thermally treating the precursor and the source materials by heating the first and second source materials and the precursor to independently controlled temperatures to evaporate thallium and oxygen from the first and second source materials in the sealed chamber and to suppress evaporation of thallium and oxygen from the precursor to form the superconductor compound having a predetermined composition ratio of oxygen.

2. The method according to claim 1 wherein, in said step of thermally treating, the first one of the source materials containing $Tl_2O$ is heated to a first temperature at which thallium is evaporated, the second one of the source materials containing $Tl_2O_3$ is heated to a second temperature at which oxygen is evaporated, and the precursor is heated at a crystallizing temperature, the first, second, and crystallizing temperatures being different from one another.

3. A method of producing a BaKBiO superconductor compound, comprising the steps of:
    (a) forming a precursor from a plurality of chemical elements including Ba, K, Bi, and O;
    (b) placing the precursor in a chamber;
    (c) placing at least two source materials in the chamber, a first one of the source materials containing $K_2O$ and a second one of the source materials containing $K_2O_2$, the first and second source materials being in a liquid or solid state;

(d) sealing the chamber in an airtight manner; and (e) thermally treating the precursor and the source materials by heating the first and second source materials and the precursor to independently controlled temperatures to evaporate potassium and oxygen from the first and second source materials in the sealed chamber and to suppress evaporation of potassium and oxygen from the precursor to form the superconductor compound having a predetermined composition ratio of oxygen.

4. A method of producing a PbZnNbO dielectric compound, comprising the steps of:

(a) forming a precursor from a plurality of chemical elements including Pb, Zn, Nb, and O;

(b) placing the precursor in a chamber;

(c) placing at least two source materials in the chamber, a first one of the source materials containing $Pb_3O_4$ and a second one of the source materials containing $PbO_2$, the first and second source materials being in a liquid or solid state;

(d) sealing the chamber in an airtight manner; and (e) thermally treating the precursor and the source materials by heating the first and second source materials and the precursor to independently controlled temperatures to evaporate lead and oxygen from the first and second source materials in the sealed chamber and to suppress evaporation of lead and oxygen from the precursor to form the dielectric compound having a predetermined composition ratio of oxygen.

5. A method of producing a tl-containing compound, comprising the steps of:

(a) forming a precursor from a plurality of chemical elements having respectively different vapor pressures;

(b) placing the precursor in a chamber;

(c) placing at least two source materials in the chamber, a first one of the source materials consisting essentially of $Tl_2O$ and a second one of the source materials consisting essentially of $Tl_2O_3$, the first and second source materials being in a liquid or solid state, and each of the source materials containing at least one chemical element which is identical to a respective chemical element contained in the precursor;

(d) sealing the chamber in an airtight manner; and (e) thermally treating the precursor and the source materials and evaporating chemical elements from the source materials in the chamber which has been sealed in order to suppress evaporation of chemical elements from the precursor and to form a compound having a predetermined composition ratio, wherein said step of thermally treating comprises heating the first and second source materials and the precursor to independently controlled temperatures.

* * * * *